United States Patent
Ahn

(10) Patent No.: US 9,730,317 B2
(45) Date of Patent: Aug. 8, 2017

(54) CIRCUIT BOARD AND DISPLAY DEVICE HAVING THE SAME

(71) Applicant: SAMSUNG DISPLAY CO., LTD., Yongin, Gyeonggi-Do (KR)

(72) Inventor: Hyeong-Cheol Ahn, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 255 days.

(21) Appl. No.: 14/219,054

(22) Filed: Mar. 19, 2014

(65) Prior Publication Data

US 2015/0043176 A1  Feb. 12, 2015

(30) Foreign Application Priority Data

Aug. 6, 2013 (KR) .................. 10-2013-0093006

(51) Int. Cl.
- *H05K 1/00* (2006.01)
- *H05K 1/02* (2006.01)
- *H05K 1/18* (2006.01)

(52) U.S. Cl.
CPC ............ *H05K 1/028* (2013.01); *H05K 1/189* (2013.01); *H05K 2201/10439* (2013.01)

(58) Field of Classification Search
CPC .................. H05K 1/028; H05K 1/189; H05K 2201/10439
USPC ........ 361/749, 751, 760, 774; 174/254, 255, 174/261
See application file for complete search history.

(56) References Cited

U.S. PATENT DOCUMENTS

| | | | | |
|---|---|---|---|---|
| 8,310,614 | B2 * | 11/2012 | Sasaki | G02F 1/1333 349/158 |
| 2001/0035930 | A1 * | 11/2001 | Yun | G02F 1/13452 349/149 |
| 2007/0091243 | A1 | 4/2007 | Hong et al. | |
| 2009/0096965 | A1 * | 4/2009 | Nagata | G02F 1/133305 349/103 |
| 2009/0184418 | A1 | 7/2009 | Hwang et al. | |
| 2012/0313116 | A1 | 12/2012 | Liao et al. | |
| 2013/0083496 | A1 * | 4/2013 | Franklin | G06F 1/1626 361/749 |
| 2014/0085587 | A1 * | 3/2014 | Liao | G09G 3/36 349/151 |

FOREIGN PATENT DOCUMENTS

| | | |
|---|---|---|
| KR | 10-2007-0019477 A | 2/2007 |
| KR | 10-2009-0080429 A | 7/2009 |
| KR | 10-2009-0132176 A | 12/2009 |
| TW | 201447839 | * 6/2013 |

* cited by examiner

*Primary Examiner* — Yuriy Semenenko
(74) *Attorney, Agent, or Firm* — Lee & Morse P.C.

(57) ABSTRACT

A display device includes a display panel including a curved surface bent along a first direction, a circuit board coupled to the display panel, the circuit board being bent along the first direction in correspondence to the curved surface of the display panel, and an integrated circuit (IC) chip on the circuit board, a short side of the IC chip extending along the first direction.

14 Claims, 4 Drawing Sheets

CIRCUIT BOARD AND DISPLAY DEVICE HAVING THE SAME

CROSS-REFERENCE TO RELATED APPLICATION

Korean Patent Application No. 10-2013-0093006, filed on Aug. 6, 2013, in the Korean Intellectual Property Office, and entitled: "Circuit Board and Display Device Having The Same," is incorporated by reference herein in its entirety.

BACKGROUND

1. Field

Embodiments relate to a circuit board and a display device having the same.

2. Description of the Related Art

Recently, various types of display devices have been developed to satisfy consumers' various requirements. Accordingly, demands for a flexible display device having a changeable shape or a curved display device having a predetermined curvature are increased.

SUMMARY

According to embodiments, there is provided a display device, including a curved surface bent along a first direction, a circuit board coupled to the display panel, the circuit board being bent along the first direction in correspondence to the curved surface of the display panel, and an integrated circuit (IC) chip on the circuit board, a short side of the IC chip extending along the first direction.

The circuit board may have a bending axis in a second direction intersecting the first direction. The IC chip may have a long side disposed in the second direction.

The IC chip may be mounted so that the center axis of the IC chip in the long-side direction corresponds to the bending axis of the circuit board.

The circuit board may include a first pad portion formed in a coupling portion of the circuit board coupled to the display panel.

The circuit board may further includes first lines extracted from a short side adjacent to the first pad portion or extracted from any one long side of the IC chip, to be coupled to the first pad portion.

The circuit board may include a second pad portion formed at an end portion different from that at which the first pad portion is positioned.

The circuit board may further includes second lines extracted from a short side adjacent to the second pad portion or extracted from any one long side of the IC chip, to be coupled to the second pad portion.

According to an aspect of the present invention, there is provided a circuit board, including: a base board configured to have a pad portion formed along a first direction; and an IC chip mounted on the base board so that a short side of the IC chip is disposed in the first direction.

The base board may have a bending axis in a second direction intersecting the first direction.

The IC chip may have a long side disposed in the second direction.

The IC chip may be mounted so that the center axis of the IC chip in the long-side direction corresponds to the bending axis of the base board.

The circuit board may further include a plurality of lines formed between the pad portion and the IC chip. Each line may be extracted from any one short or long side of the IC chip, to be coupled to the pad portion.

The base board may be formed as a thin film board having flexibility.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
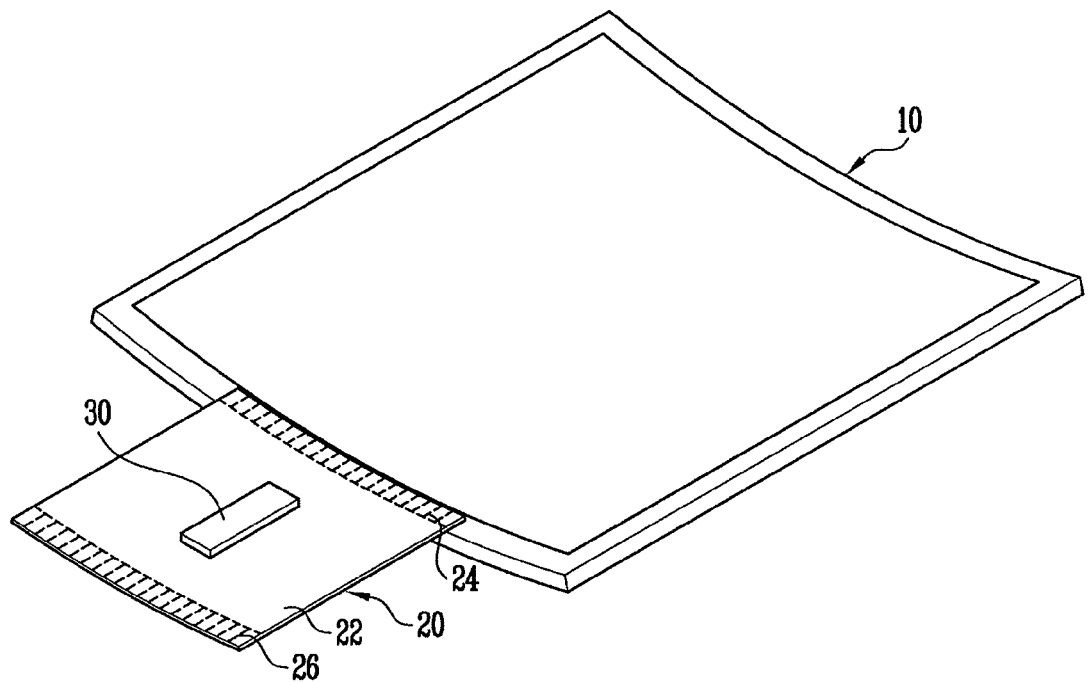
FIG. 1 illustrates a perspective view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Also, when a first element is described as being "coupled to" a second element, the first element may directly coupled to the second element or may be indirectly coupled to the second element via a third element. Further, some of the elements that are not essential to the complete understanding of the invention are omitted for clarity. Also, like reference numerals refer to like elements throughout.

FIG. 1 illustrates a perspective view of a display device according to an embodiment.

Referring to FIG. 1, a display device according to an embodiment may include a display panel 10 and a circuit board 20 electrically coupled to the display panel 10. The display panel 10 may be implemented as various types of display panels, e.g., an organic light emitting display panel.

The display panel 10 may be formed to have at least one curved surface bent along a first direction. For example, the display panel 10 may be formed as a curved display panel having a curved surface bent along a lateral direction. In this case, a bending axis of the display panel 10 may be formed in a second direction intersecting the first direction, e.g., the bending axis may extend along a longitudinal direction perpendicular to the lateral direction.

However, embodiments are not necessarily applicable only to a curved display panel having a predetermined curvature. As another example, the display panel 10 may be a flexible display panel having a deformable, e.g., changeable, shape. Here, the display panel 10 may be bent to have a curvature within a predetermined range along the first direction.

The circuit board 20 may be electrically coupled to the display panel 10 through a first pad portion 24 to supply a driving signal to the display panel 10. To this end, the circuit board 20 may include an integrated circuit (IC) chip 30 in which circuit devices for driving the display panel 10 are built. For example, the IC chip 30 may be driven by receiving a control signal supplied from a main board (not shown), e.g., the circuit board 20 may be electrically coupled to the main board, etc. through a second pad portion 26.

The circuit board 20 may be flexibly bent to correspond to the curved surface of the display panel 10. For example, a base board 22 of the circuit board 20 may be formed as, e.g., a thin film board having flexibility.

In this embodiment, the IC chip 30 is mounted on the circuit board 20 so that a short side of the IC chip 30 is disposed in the direction where the display panel 10 and the circuit board 20 are bent, i.e., the first direction. For example, the short side of the IC chip 30 may extend along the first direction to face and be substantially parallel to a contact surface between the display panel 10 and the circuit board 20.

Accordingly, it is possible to prevent or substantially minimize physical stress according to the bending of the circuit board 20 from causing a crack in the IC circuit chip 30 even when the IC chip 30 is mounted on the bent surface of the circuit board 20. For example, even if the IC chip 30 overlaps a bent portion of the circuit board 20, positioning of a longitudinal direction of the IC chip 30 to align with the bending axis of the circuit board 20 may prevent or substantially minimize physical stress on the IC chip 30 due to bending of the circuit board 20, thereby preventing or substantially minimizing generation of cracks in the IC circuit chip 30. In addition, separation of the IC chip 30 from the circuit board 20 may be prevented or substantially minimized, thereby improving the bonding reliability of the circuit board 20 and the IC chip 30.

Figure 2A:
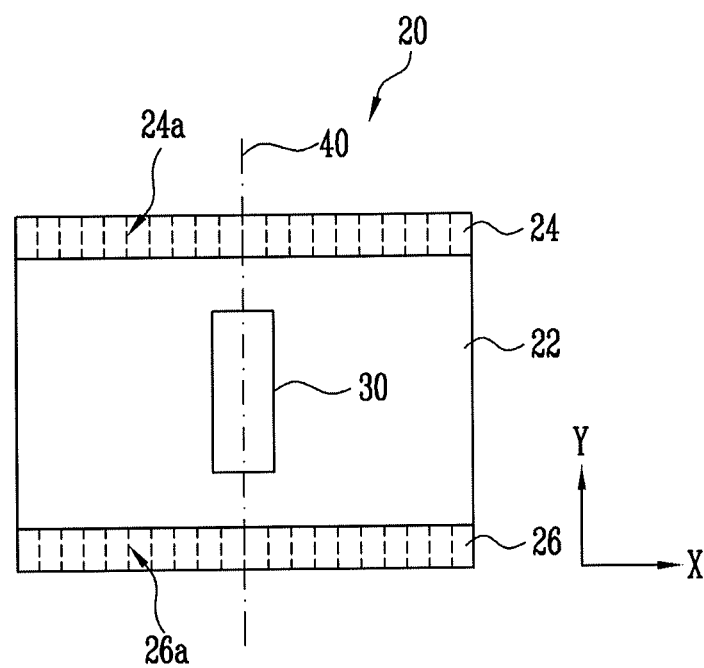
FIG. 2A illustrates a plan view of an embodiment of a circuit board in FIG. 1.
Figure 2B:
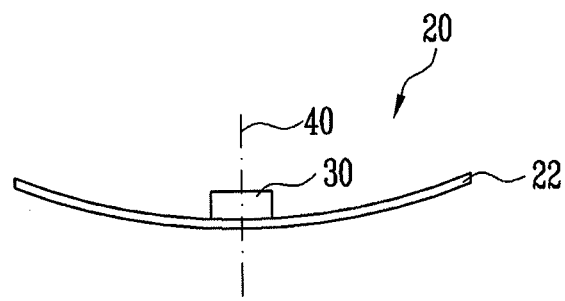
FIG. 2B illustrates a sectional view of the circuit board in FIG. 2A.

FIG. 2A illustrates a plan view of an embodiment of the circuit board 20. FIG. 2B illustrates a sectional view of the circuit board 20.

In detail, referring to FIGS. 2A and 2B, the circuit board 20 according to this embodiment may be formed in a shape bent in a first direction, e.g., along an X-direction. In this case, the circuit board 20 may have a bending axis 40 disposed in a second direction, e.g., along a Y-direction, intersecting the first direction. For example, if a major surface of the circuit board 20 is in the XY-plane, as illustrated in FIG. 2A, sides of the circuit board 20 extending along the X-direction are bent in the X-direction, i.e., curve along the first X-direction, around the bending axis 40, while sides of the circuit board 20 extending along the Y-direction remain linear.

It is noted that FIGS. 2A and 2B illustrate a bent state of the circuit board 20. However, the circuit board 20 may be formed to maintain a flat state before the circuit board 20 is coupled to the curved display panel 10. In this case, the circuit board 20 has flexibility.

Referring back to FIGS. 2A-2B, the base board 22 of the circuit board 20 is a base material of the circuit board 20, e.g., the base board 22 may be a thin film board having flexibility. For example, in the present embodiment, the base board 22 may have the bending axis 40 in the second direction intersecting the first direction so as to be bent in at least the first direction.

The first pad portion 24 may be formed at one end portion of the circuit board 20, e.g., a coupling portion of the circuit board 20 coupled to the display panel 10. The first pad portion 24 may include a plurality of first pads 24a configured to allow the display panel 10 to be electrically coupled to various kinds of power lines and/or signal lines of the circuit board 20. That is, power sources and/or driving signals from the circuit board 20 may be output to the display panel 10 through the first pad portion 24. The first pad portion 24 may be formed on the base board 22 along the first direction. In this case, the plurality of first pads 24a may be arranged along the first direction in the first pad portion 24.

The second pad portion 26 may be further formed at another end portion of the circuit board 20, e.g., a coupling portion of the circuit board 20 coupled to the main board (not shown), etc. For example, the first and second pad portions 24 and 26 may be formed at end portions of the circuit board 20, opposite to each other. In this case, the second pad portion 26 may include a plurality of second pads 26a configured to allow the circuit board 20 to be electrically coupled to various types of power lines and/or signal lines of the main board. That is, power sources and/or control signals from an external driving circuit, e.g., the main board, may be input to the circuit board 20 through the second pad portion 26. Like the first pad portion 24, the second pad portion 26 may be formed in the base board 22 along the first direction. In this case, the plurality of second pads 26a may be arranged along the first direction in the second pad portion 26.

The circuit board 20 may include the IC chip 30, in which various types of circuit devices for driving the display panel 10 are built. The IC chip 30 is mounted on the base board 22.

In the present embodiment, the IC chip 30 may be mounted on the base board 22 so that a short side of the IC chip 30 is disposed in the first direction where the circuit board 20 is bent, and a long side of the IC chip 30 is disposed in the second direction where the bending axis 40 of the circuit board 20 is disposed. For example, the IC chip 30 may be mounted so that a center axis of the IC chip 30 in the long-side direction corresponds to, e.g., overlaps with, the bending axis 40 of the circuit board 20 (or the base board 22). In this case, it is possible to minimize physical stress due to bending of the circuit board 20, which is transferred to the IC chip 30.

However, embodiments are not limited to the center axis of the IC chip 30 in the long-side direction corresponding to the bending axis 40 of the circuit board 20, as will be discussed with reference to FIGS. 3A-3B.

Figure 3A:
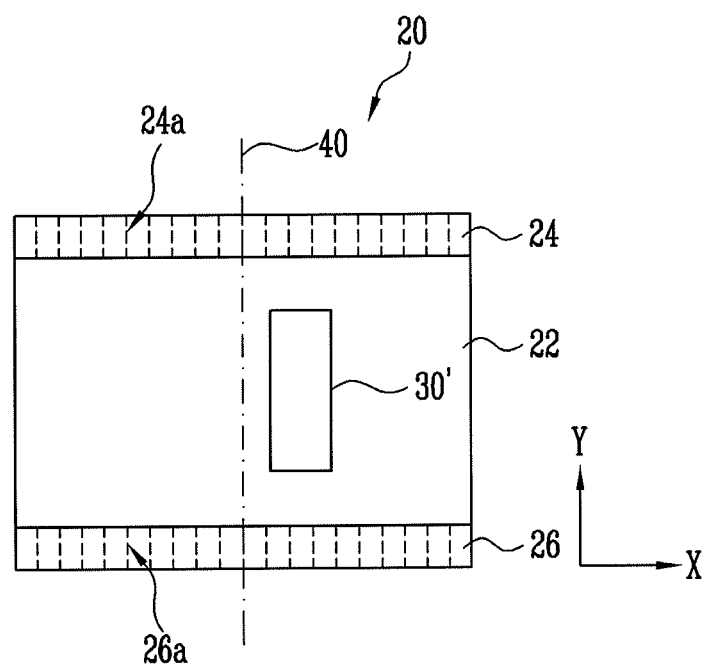
FIG. 3A illustrates a plan view of another embodiment of the circuit board in FIG. 1.

FIG. 3A illustrates a plan view of another embodiment of a circuit board shown in FIG. 1. FIG. 3B illustrates a sectional view of the circuit board shown in FIG. 3A. For convenience, in FIGS. 3A and 3B, portions identical or similar to those of FIGS. 2A and 2B are designated by like reference numerals, and their detailed descriptions will be omitted.

Figure 3B:
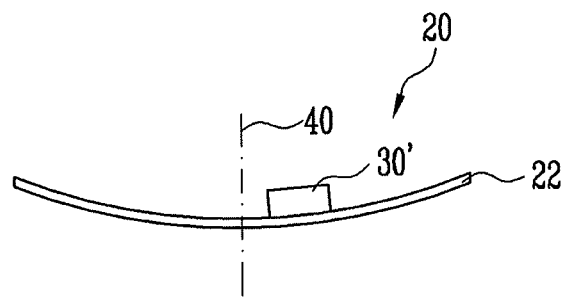
FIG. 3B illustrates a sectional view of the circuit board in FIG. 3A.

For example, as shown in FIGS. 3A and 3B, an IC chip 30' is mounted so that the center axis of the IC chip 30' in the long-side direction is disposed in the direction where the bending axis 40 is disposed. In this case, the IC chip 30' may be disposed to be shifted by a predetermined distance from the bending axis 40. In this case, the short side of the IC chip 30' is also disposed in the first direction where the circuit board 20 is bent, and thus it is possible to prevent a crack in the IC chip 30'.

Embodiments are not limited to the configurations in FIGS. 2A to 3B. For example, the IC chip 30 or 30' may be mounted to be twisted, e.g., rotated, by a predetermined angle with respect to the first or second direction. However, the direction where the IC chip 30 or 30' is mounted may be modified in a range to an extent where it is possible to prevent a crack in the IC chip 30 or 30' due to the physical stress according to the bending of the circuit board 20.

As described above, according to embodiments, when the IC chip 30 or 30' is mounted on the bendable circuit board 20 coupled to the display panel 10, the IC chip 30 or 30' is mounted so that the short side of the IC chip 30 or 30' is disposed in the direction where the circuit board 20 is bent. Accordingly, it is possible to prevent or minimize physical stress applied to the IC chip 30 or 30' due to bending of the circuit board 20, i.e., stress transferred from the bent surface of the circuit board 20 to the IC chip 30 or 30', thereby preventing damage of the IC chip 30 or 30'.

In contrast, if a long side, rather than a short side, of an IC chip is disposed in the bending direction of a conventional circuit board, the physical stress of the bent circuit board concentrates on the IC chip. As such, a crack in the IC chip, which is deficient in flexibility, may be caused.

However, according to embodiments, the short side of the IC chip 30 or 30' is disposed along the first direction where the circuit board 20 is bent, and the long side of the IC chip 30 or 30' is disposed along the direction of the bending axis 40, i.e., along a direction intersecting, e.g., perpendicular to, the first direction. Thus, the physical stress according to the bending of the circuit board 20 is hardly transferred to the long side of the IC chip 30 or 30', and accordingly, it is possible to prevent or substantially minimize damage to the IC chip 30 or 30' e.g., a crack.

Figure 4:
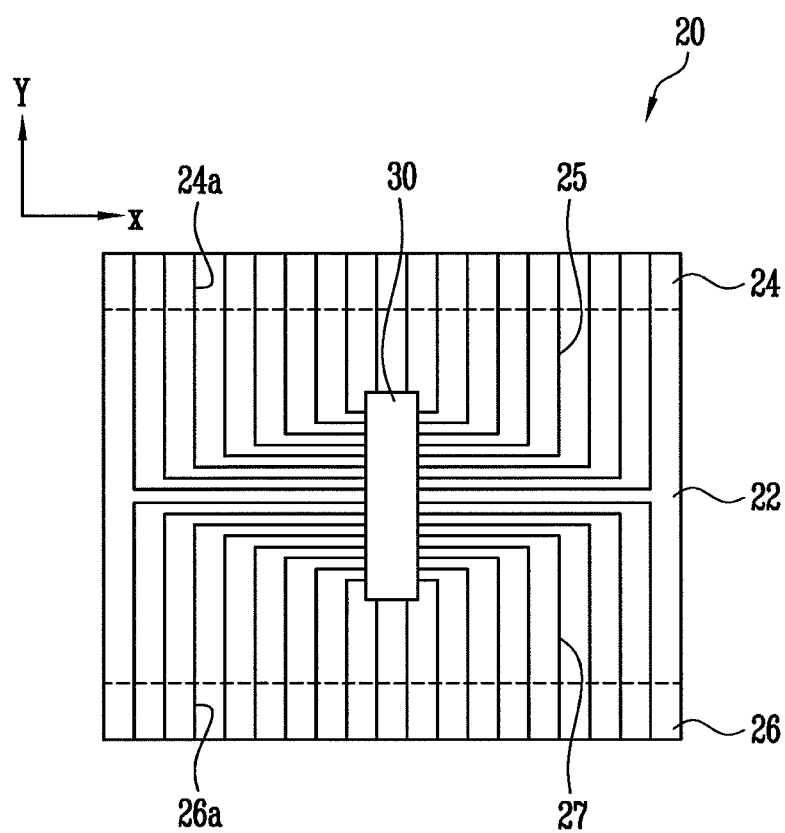
FIG. 4 illustrates a plan view of a line routing structure of the circuit board according to an embodiment.

FIG. 4 illustrates a plan view of a line routing structure of the circuit board 20. For convenience, the line routing structure illustrates the circuit board 20 of FIGS. 2A and 2B in a flat state. However, when the circuit board 20 shown in FIG. 4 is coupled to the curved display panel 10 or the like, the circuit board 20 may be in a bent state. Further, even when the circuit board 20 is bent as described above, the line routing structure of the circuit board 20 can be identically maintained.

Referring to FIG. 4, the circuit board 20 may include first lines 25 formed between the first pad portion 24 and the IC chip 30 and/or second lines 27 formed between the second pad portion 26 and the IC chip 30. For example, the first lines 25 may be set as output lines of the circuit board 20, and the second lines 27 may be set as input lines of the circuit board 20.

However, embodiments are not limited to a structure including the first lines 25 and/or the second lines 27 extracted from only one of the short and long sides of the IC chip 30. For example, the circuit board 20 may have a line routing structure in which the first lines 25 and/or the second lines 27 are extracted from all the short and long sides of the IC chip 30.

For example, each first line 25 may be extracted from a short side adjacent to the first pad portion 24 of the IC chip 30 or may be extracted from any one of the left and right long sides of the IC chip 30, to be coupled to the first pad portion 24. In addition, each second line 27 may be extracted from a short side adjacent to the second pad portion 26 of the IC chip 30 or may be extracted from any one of the left and right long sides of the IC chip 30, to be coupled to the second pad portion 26. As described above, the circuit board 20 is designed so that the first lines 25 and/or the second lines 27 are extracted from all the short and long sides of the IC chip 30, thereby sufficiently ensuring a space for line routing.

By way of summation and review, in a curved display device, a display panel has a curved surface while being bent along at least any one direction. For example, the display panel may have a curved surface while being bent along a lateral direction. In this case, a circuit board coupled to the display panel is also formed in a shape bent along the direction where the display panel is bent, so that a curved surface is formed in the circuit board.

The curved surface of the circuit board is formed on the mounting surface of an IC chip. Therefore, as physical stress according to the bending of the circuit board is transferred to the IC chip, a crack may be generated in the IC chip.

In contrast, according to embodiments, when the IC chip is mounted on the bent circuit board, the IC chip is mounted so that the short side of the IC chip is disposed in the direction where the circuit board is bent. Accordingly, it is possible to prevent the IC chip from being damaged due to physical stress according to the bending of the circuit board. Further, it is possible to improve the bonding reliability of the circuit board and the IC chip. In other words, a crack in or separation of an integrated circuit chip mounted on the circuit board may be prevented, even when the circuit board is coupled to a display panel having a curved surface. In addition, according to an embodiment, the circuit board is designed so that the lines are extracted from all the short and long sides of the IC chip, thereby sufficiently ensuring a space for line routing.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
    a display panel including a curved surface bent along a first direction based on a bending axis in a second direction intersecting the first direction;
    a circuit board coupled to the display panel, the circuit board being bent along the first direction in correspondence to the curved surface of the display panel; and
    an integrated circuit (IC) chip mounted on the circuit board and having a short side, the short side of the IC chip extending along the first direction, wherein
    the circuit board includes a first pad portion facing the short side of the IC chip and extending along the first direction of the circuit board, wherein
    the circuit board has the bending axis across a center portion of the circuit board, and wherein
    the IC chip is spaced apart from the bending axis by a predetermined distance in the first direction.

2. The display device as claimed in claim 1, wherein the IC chip has a long side extending disposed in the second direction and facing the bending axis.

3. The display device as claimed in claim 2, wherein a center axis of the IC chip in the second direction corresponds to the bending axis of the circuit board.

4. The display device as claimed in claim 1, wherein the first pad portion of the circuit board is coupled to the display panel.

5. The display device as claimed in claim 4, wherein the circuit board further comprises first lines extending from at least one of the short side of the IC chip and a long side of the IC chip, to be coupled to the first pad portion.

6. The display device as claimed in claim 1, wherein the circuit board further comprises a second pad portion corresponding to the short side of the IC chip and extending along the first direction of the circuit board at an end portion opposite the first pad portion.

7. The display device as claimed in claim 6, wherein the circuit board further comprises second lines extending from at least one of the short side of the IC chip and a long side of the IC chip, to be coupled to the second pad portion.

8. The display device as claimed in claim 1, wherein the display panel is flexible and deformable.

9. The display device as claimed in claim 1, wherein the IC chip drives the display panel by supplying driving signals to the display panel through the circuit board.

10. A circuit board, comprising:
a base board including at least one pad portion extending along a first direction; and
an integrated circuit (IC) chip mounted on the base board and having a short side, the short side of the IC chip extending along the first direction, wherein
the at least one pad portion of the base board facing the short side of the IC chip, wherein
the base board has a bending axis, the bending axis being in a second direction intersecting the first direction and being across a center portion of the base board, and wherein
the IC chip is spaced apart from the bending axis by a predetermined distance in the first direction.

11. The circuit board as claimed in claim 10, wherein the IC chip has a long side extending in the second direction and facing the bending axis.

12. The circuit board as claimed in claim 10, wherein a center axis of the IC chip in the second direction corresponds to the bending axis of the base board.

13. The circuit board as claimed in claim 10, further comprising a plurality of lines between the at least one pad portion and the IC chip, each line extending from at least one of the short side of the IC chip and a long side of the IC chip, to be coupled to the pad portion.

14. The circuit board as claimed in claim 10, wherein the base board is a flexible thin film board.

* * * * *